United States Patent
Ghoshal

[19]

[11] Patent Number: 6,065,293
[45] Date of Patent: May 23, 2000

[54] THERMOELECTRIC COOLING SYSTEM

[75] Inventor: Uttam Shyamalindu Ghoshal, Austin, Tex.

[73] Assignee: International Business Machines Corporation, Armonk, N.Y.

[21] Appl. No.: 09/259,377

[22] Filed: Feb. 26, 1999

[51] Int. Cl.$^7$ .................................................. F25B 21/02
[52] U.S. Cl. .................................................. 62/3.2; 62/3.7
[58] Field of Search ........................................ 62/3.7, 3.2

[56] References Cited

U.S. PATENT DOCUMENTS

| | | | |
|---|---|---|---|
| 2,921,973 | 1/1960 | Heikes et al. ........................ | 62/3.2 |
| 5,275,001 | 1/1994 | Yokotani et al. ..................... | 62/3.7 |
| 5,385,022 | 1/1995 | Kornblit ............................... | 62/3.7 |
| 5,742,676 | 4/1998 | Courtois .............................. | 379/413 |
| 5,867,990 | 2/1999 | Ghoshal .............................. | 62/3.7 |
| 5,900,722 | 5/1999 | Scott et al. .......................... | 322/46 |
| 5,966,938 | 10/1999 | Nagakubo et al. .................. | 62/3.2 |

OTHER PUBLICATIONS

Gerald Mahan, et al., "Thermoelectric Materials: New Approaches to an Old Problem", Physics Today, pp. 42–47, 1997.

Fifteenth International Conference on Thermoelectrics, IEEE No. 96TH8169, Mar. 1996.

*Primary Examiner*—Henry Bennett
*Assistant Examiner*—Mark Shulman
*Attorney, Agent, or Firm*—Casimer K. Salys; Antony P. Ng; Andrew J. Dillon

[57] ABSTRACT

A highly efficient current controlled thermoelectric cooling system is disclosed. The highly efficient current controlled thermoelectric cooling system includes a first thermal sink, a second thermal sink, a thermoelectric element, and a variable current source. The first thermal sink has a temperature higher than an ambient temperature while the second thermal sink has a temperature lower than the ambient temperature. The first thermal sink is continuously coupled to the thermoelectric element while the second thermal sink is selectively coupled to the thermoelectric element via a mass. A variable current source provides a controlled current pulse to the thermoelectric element such that heat transfer can be effectively achieved between the thermoelectric element and both thermal sinks.

10 Claims, 4 Drawing Sheets

THERMOELECTRIC COOLING SYSTEM

CROSS REFERENCE TO A RELATED APPLICATION

The present application is related to a copending U.S. patent application entitled "Thermoelectric Cooling with Dynamic Switching to Isolate Heat Transport Mechanisms," Ser. No. 08/988,621 (Attorney Docket No. AT9-97-707) filed on Dec. 10, 1997. The above-mentioned patent application is also assigned to the assignee of the present invention, the content of which is incorporated herein by reference.

BACKGROUND OF THE INVENTION

1. Technical Field

The present invention relates to cooling systems in general, and in particular to a thermoelectric cooling system. Still more particularly, the present invention relates to a thermoelectric cooling system for cooling integrated circuit devices.

2. Description of the Prior Art

The fact that integrated circuit (IC) devices can operate faster as temperature decreases is well-known in the art. For example, the performance of an IC device improves by 50% when operated at −50° C. instead of ambient room temperature, and a 200% speed improvement can be achieved by cooling the IC device with liquid nitrogen to −196° C. Similar performance improvements have also been observed on interconnects within the IC device. For example, interconnect resistance decreases by a factor of two when the IC device is operated at −50° C. rather than at ambient room temperature. Thus, IC device performance can be significantly benefited by sub-ambient temperature, which begs the question of how to cool IC devices to a sub-ambient temperature in an efficient and cost effective manner.

Conventionally, sub-ambient cooling is accomplished through gas/liquid vapor compression-based cooling systems, using Freon-type refrigerants to provide heat transfer. Although vapor compression-based cooling can be quite efficient, a significant amount of hardware, which includes at a minimum, a compressor, a condenser, an evaporator, and related coolant transfer plumbing, is required. As a result, vapor compression-based cooling has not found general acceptance for cooling small objects such as IC devices.

A more promising method for cooling IC devices is thermoelectric cooling. In addition to being compact, thermoelectric devices such as Peltier devices are also very reliable because they are typically have no associated moving parts. However, a key negative aspect of thermoelectric devices is their inefficiency. A Peltier device cooling system typically has an efficiency of approximately 20% for a relatively nominal temperature differential between a cold sink and the ambient room temperature. For example, if a Peltier device cooling system is utilized to cool at a rate of one watt to attain a sub-ambient temperature of 0° C., five watts will be required to power the Peltier device cooling system. Also, as the amount of heat required to be transferred increases, the total power needed to be dissipated into the ambient environment mandates large convection devices and large power supply circuits. Thus, Peltier device cooling systems have not been considered a broadly applicable technology for cooling IC devices either. Consequently, it would be desirable to provide an improved thermoelectric system for producing thermoelectric cooling on IC devices.

SUMMARY OF THE INVENTION

In accordance with a preferred embodiment of the present invention, a highly efficient current controlled thermoelectric cooling system includes a first thermal sink, a second thermal sink, a thermoelectric element, and a variable current source. The first thermal sink has a temperature higher than an ambient temperature while the second thermal sink has a temperature lower than the ambient temperature. The first thermal sink is continuously coupled to the thermoelectric element while the second thermal sink is selectively coupled to the thermoelectric element via a mass. A variable current source provides a controlled current pulse to the thermoelectric element such that heat transfer can be effectively achieved between the thermoelectric element and both thermal sinks.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

In order to understand how the present invention improves the efficiency of thermoelectric cooling, it is necessary to understand why Peltier type thermoelectric cooling system is inefficient in the first place.

Figure 1:
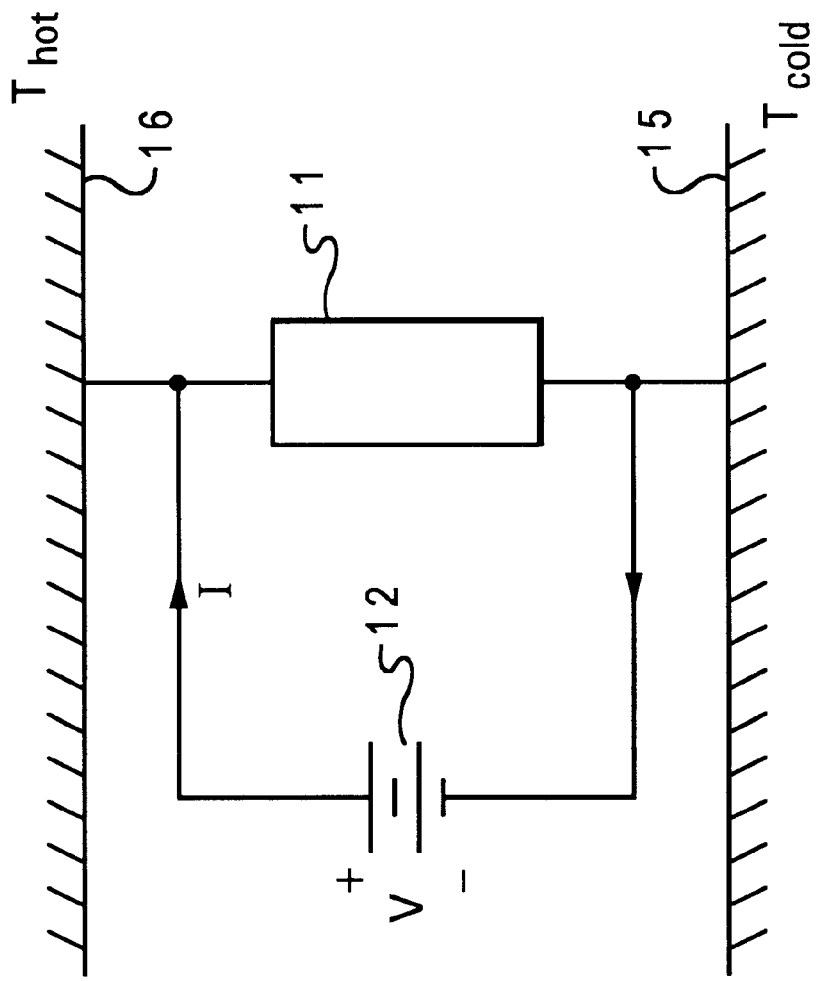
FIG. 1 is a pictorial representation of a conventional Peltier type thermoelectric cooling system having a Peltier device.

Referring now to the drawings and in particular to FIG. 1, there is depicted a pictorial representation of a conventional Peltier type thermoelectric cooling system 10 having a Peltier device 11. Peltier device 11 is typically fabricated from Peltier materials such as Bismuth Telluride ($Bi_2Te_3$) or Lead Telluride (PbTe). In contrast to most metals that typically exhibit both high electrical and high thermal conductivity, Peltier materials exhibit very high electrical conductivity and relatively low thermal conductivity. As shown, Peltier device 11 is connected to a DC power supply 12 that provides an electric field V and a current I across Peltier device 11. During operation, Peltier device 11 transports electrons from a cold sink 15 to a hot sink 16, in response to the electric field placed across Peltier device 11. The desired heat transfer is from cold sink 15 at temperature $T_{cold}$ to hot sink 16 at temperature $T_{hot}$.

The net heat energy transported by Peltier device 11 can be expressed as the arithmetic combination of three terms, namely, a thermoelectric (or Peltier) term, a negative Joule heating (or resistive) term, and a negative thermal conductivity term, as shown in equation (1).

$$q = \alpha T_{cold} I - \frac{1}{2} I^2 R - K\Delta T \quad (1)$$

The thermoelectric term (i.e., $\alpha T_{cold} I$) is composed of a Seebeck coefficient $\alpha$, the temperature of operation $T_{cold}$, and the applied current I. The negative Joule heating term (i.e., $\frac{1}{2}I^2R$) reflects that only half the Joule heating goes to cold sink 15 while the other half goes to hot sink 16. Lastly, the negative conductivity term (i.e., $K\Delta T$) is attributable to thermal conduction that represents the heat flow (or heat conduction) through Peltier device 11, as defined by the thermal conductivity K of Peltier device 11, from hot sink 16 to cold sink 15.

As shown in equation (1), the thermoelectric term increases in direct proportion to the current, the negative Joule heating term increases in direct proportion to the square of the current, and the negative conductivity term increases in direct proportion to the hot sink-to-cold sink temperature difference. Thus, equation (1) clearly reflects how quickly Peltier device 11 would become inefficient when the current is high and/or the temperature differential between the hot sink and the cold sink is also high.

Equation (2) below defines a coefficient of performance for Peltier device 11. The coefficient of performance is the ratio of the net heat energy transported at low temperature to the power consumed in Peltier device 11.

$$\eta = \frac{\alpha T_{cold} I - \frac{1}{2} I^2 R - K\Delta T}{I^2 R + \alpha I \Delta T} \quad (2)$$

In equation (2), the numerator represents the net cooling capability of Peltier device 11, and the denominator represents the total energy provided by power supply 12. The individual elements of the numerator are the same as described in reference to equation (1) supra. As for the denominator, the first element is the total Joule heating, and the second element is the heat energy transport work done by Peltier device 11 in moving energy from cold sink 15 to hot sink 16.

Based upon the above-mentioned relationship, the maximum coefficient of performance possible for a Peltier device in the configuration of FIG. 1 is given by equation (3), as follow:

$$\eta_{max} = \left(\frac{T_{cold}}{\Delta T}\right)\left(\frac{\gamma - \frac{T_{hot}}{T_{cold}}}{\gamma + 1}\right) \quad (3)$$

The parameter $\gamma$ can be further expressed in terms of the Seebeck coefficient $\alpha$, an electrical conductivity $\sigma$, and a thermal conductivity $\gamma$, as follow:

$$\gamma = \sqrt{1 + \frac{\gamma^2}{RK}\left(\frac{T_{hot} + T_{cold}}{2}\right)} \quad (4)$$

$$= \sqrt{1 + \frac{\alpha_2 \sigma}{\lambda} \overline{T}}$$

$$= \sqrt{1 + \overline{ZT}}$$

The first factor in equation (3) (i.e., $T_{cold}/\Delta T$) is the Carnot coefficient, which is the maximum efficiency possible for any heat pump operating between two thermal sinks, such as a hot sink and a cold sink. The second factor in equation (3) represents the non-ideal thermoelectric cooling, which can also be characterized by a figure of merit $\overline{ZT}$. Note that $\eta \rightarrow (T_{cold}/\Delta T)$ as $\gamma \rightarrow \infty$. To date, it has been very difficult to develop a thermoelectric material that possess a high value of $\overline{ZT}$. The prevalent thermoelectric materials for manufacturing thermoelectric coolers have been Bismuth Telluride and Lead Tellurium, which have $\overline{ZT}$ values of approximately 0.3–0.5 at room temperature. Obviously, the maximum coefficient of performance will be increased if the $\overline{ZT}$ value is increased; however, even if thermoelectric materials having a $\overline{ZT}$ value of 1 can be formed, a thermoelectric cooling system is still not competitive at all when compared with mechanical vapor compression cooling systems.

Another constraint of thermoelectric cooling systems is that only a limited temperature excursion below ambient temperature is attainable. This is because, as mentioned earlier, the efficiency of Peltier device 11 degrades very quickly with an increasing temperature differential between hot sink 16 and cold sink 15. The maximum temperature differential possible is given by:

$$\Delta T_{max} = \frac{1}{2} ZT_{cold}^2 \quad (5)$$

For Bismuth Telluride having a $\overline{ZT}$ of approximately 0.5, the $T_{max}$ is 75° K at 300° K.

Thus, there are many fundamental constraints that limit the efficiency of a conventional thermoelectric cooling system.

Figure 2:
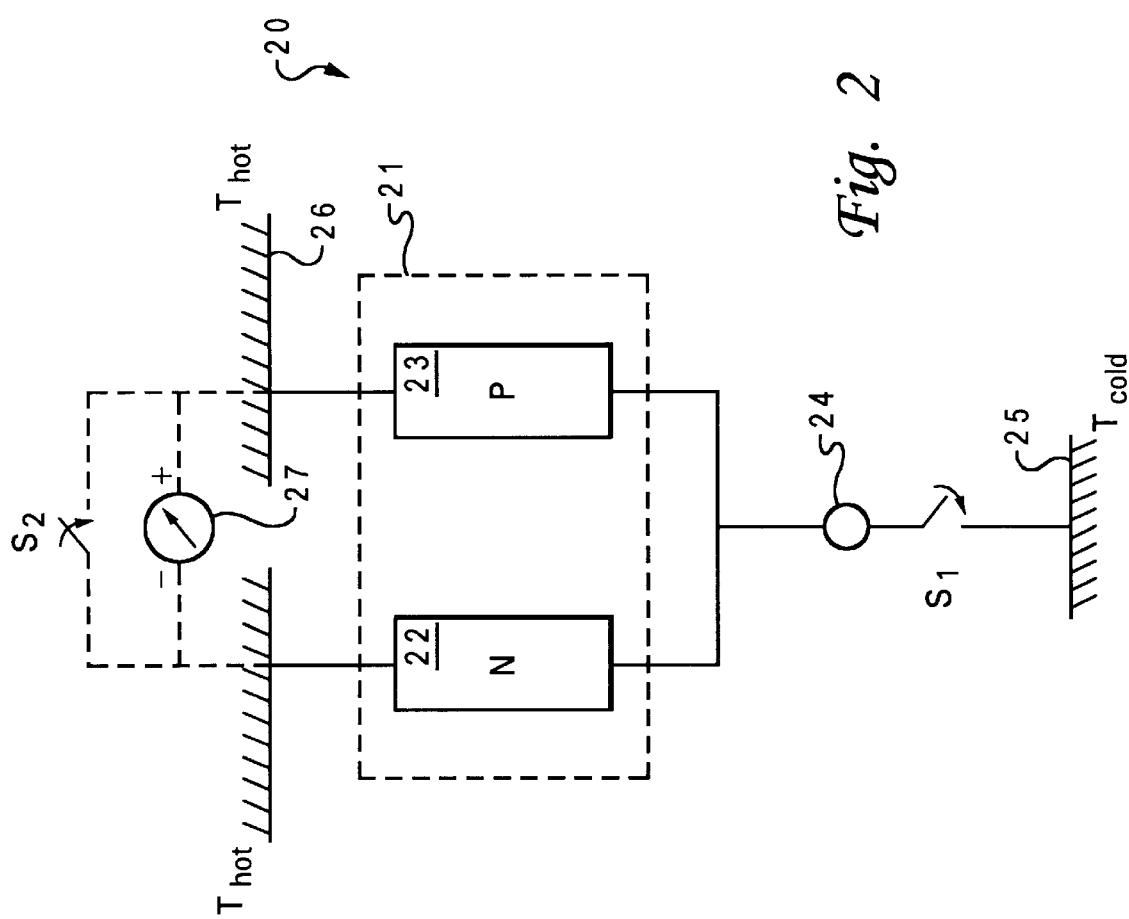
FIG. 2 is a pictorial representation of a Peltier type thermoelectric cooling system having a Peltier device, in accordance with a preferred embodiment of the present invention.

With reference now to FIG. 2, there is depicted a pictorial representation of a Peltier type thermoelectric cooling system 20 having a Peltier device 21, in accordance with a preferred embodiment of the present invention. As shown, Peltier device 21 can be coupled to a cold sink 25 via a mass 24 and a thermal switch $S_1$. Thermal switch $S_1$ is preferably a thermal switch such that any electrical conduction, Joule heating, or resistive losses, associated with a current flow can be eliminated. Peltier device 21 is also coupled to a hot sink 26 via a thermal path having little thermal resistance. In addition, a variable current source 27 provides an electrical current to Peltier device 21. Because the resistance of Peltier device 21 is very low, even a few millivolts across Peltier device 21 would produce an electrical current in the order of an ampere. Peltier device 21 produces a heat transfer at the interfaces with cold sink 25 and hot sink 26 when electrical current is passing through Peltier device 21. The heat transfer of Peltier device 21 can be utilized for cooling cold sink 25, and in turn, utilized for cooling IC devices.

When selecting suitable materials for making Peltier device 21, the fermi-level differences of all the thermocouple components must be maximized in order to maximize the thermoelectric cooling effects of thermoelectric cooling system 10. This can be accomplished by utilizing semiconductors having p-n junctions. Preferably, separate p-type and n-type thermoelectric elements should be used because the need for electrical leads at the cold end can be eliminated, thereby the parasitic heat conduction paths between the hot and cold ends are reduced. Thus, as shown in FIG. 2, Peltier device 21 utilizes two dissimilar thermoelectric elements, namely, an n-type thermoelectric element 22 and a p-type thermoelectric element 23. Preferably, n-type thermoelectric element 22 has n-type doping and p-type thermoelectric element 23 has p-type doping. The thermoelectric cooling effect does not depend on the nature of the fabrication of the junction between the two materials, which can be soldered, fused, or welded. The thermoelectric cooling effect relies only on the bulk material properties.

As a preferred embodiment of the present invention, the electrical current supplied by variable current source 27 to Peltier device 21 is in the form of a current pulse. The rise time (or slew rate) and the amplitude of the current pulse is directly proportional to the temperature differential across Peltier device 21, or specifically, the temperature differential between $T_{hot}$ of hot sink 26 and the temperature of mass 24. During operation, mass 24 is selectively coupled to cold sink 25 via thermal switch $S_1$ after mass 24 has been gradually cooled to a low temperature $T_{low}$. The cooling capacity of Peltier device 21 is $mX_s\Delta T$ joules per cycle, where m is the mass and $X_s$ is the specific heat capacity of mass 24. As a result, hot sink 26 is heated while cold sink 25 is cooled by Peltier device 21.

Figure 3:
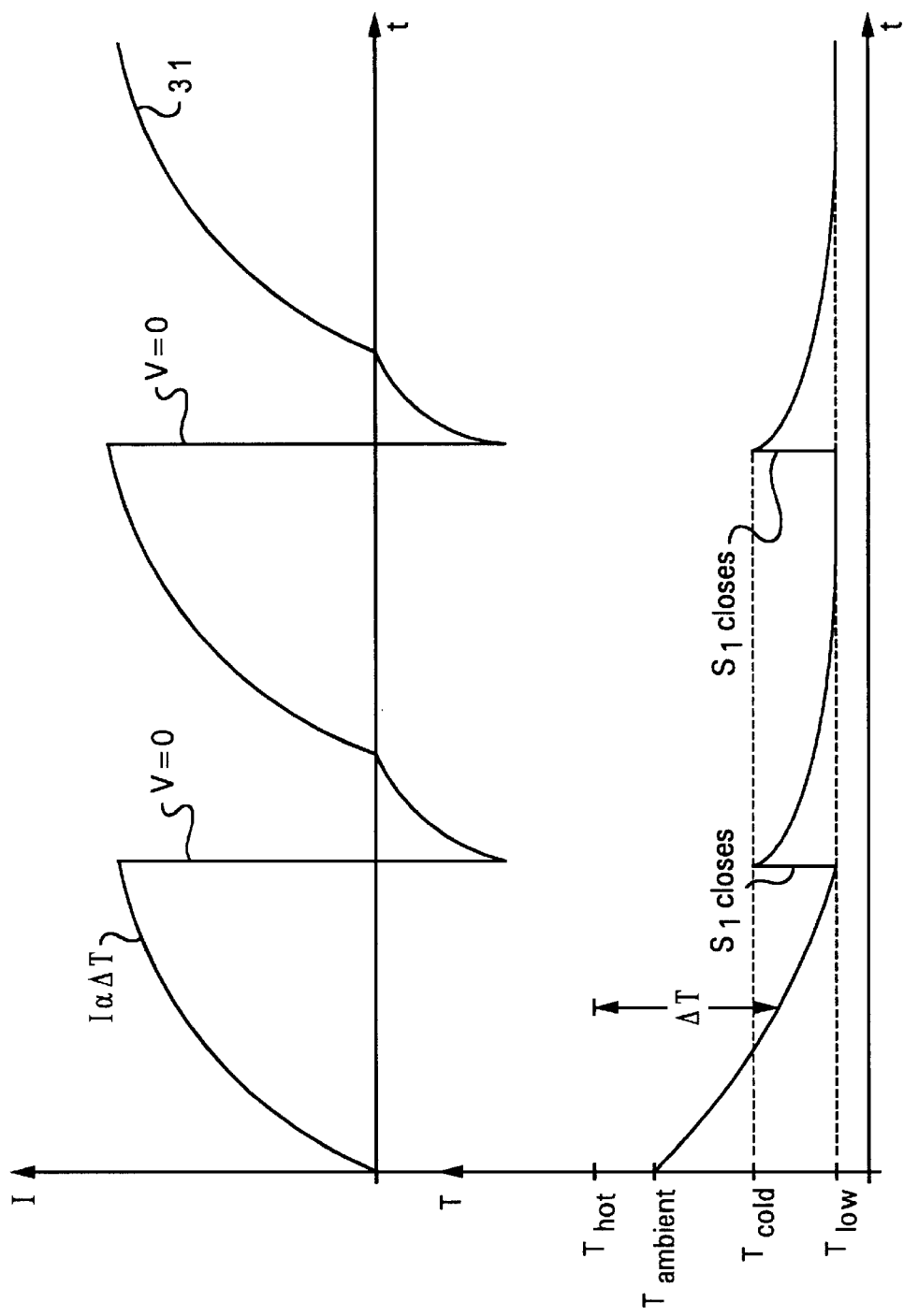
FIG. 3 is a graphical illustration of the timing relationship between the current pulse generated by a variable current source and the temperature of a mass within the thermoelectric cooling system from FIG. 2, in accordance with a preferred embodiment of the present invention.

Referring now to FIG. 3, there is depicted a graphical illustration of the timing relationship between the current pulse generated by variable current source 27 and the temperature of mass 24, in accordance with a preferred embodiment of the present invention. Initially, the temperature of mass 24 is at $T_{ambient}$. Upon the flow of current pulse 31 within Peltier device 21, the temperature of mass 24 begins to fall, which effectively increases the relative temperature differential $\Delta T$ from hot sink 26. After the temperature of mass 24 has reached $T_{low}$, variable current supply 27 will be turned off (alternatively, switch $S_2$ of FIG. 2 can be closed) such that the voltage across Peltier device 21 will become zero (V=0). At this time, thermal switch $S_1$ will be closed momentarily, connecting mass 24 to cold sink 25 for a brief moment such that heat transfer can occur between mass 24 and cold sink 25. The temperature of mass 24 then rises from $T_{low}$ to $T_{cold}$ (i.e., the temperature of cold sink 25) after the brief contact. The negative portion of current pulse 31 represents the inverse "generator" current that occurs within Peltier device 21 due to the finite temperature differential across thermoelectric elements 22, 23. The electronic conduction increases the effective thermal conductance of thermoelectric elements 22, 23 and reduces the time required to attain temperature equilibrium between mass 24 and cold sink 25.

Current pulse 31 is preferably a function of the temperature differential between $T_{hot}$ and the temperature of mass 24, as determined across Peltier device 21. However, the temperature of the cold end of Peltier device 21 (i.e., the temperature of mass 24) can also be utilized to control the current pulse because a defined temperature relationship can be empirically determined between the temperature of the cold end and the temperature differential across Peltier device 21 for each implementation.

The transient character of the heat transfer operation disclosed herein acknowledges that thermoelectric heat transfer occurs immediately upon the receipt of a relative voltage whereas Joule heating and subsequent thermoelectric element conduction loss are delayed effects. Thus, the present invention relies on the different time scales and time constants, resistance heating and thermal conduction. The ability to control the rise time of current pulse 31 and the duty cycle of thermal switch $S_1$ provides flexibility in defining switching synchronization for the present invention. Both current pulse 31 and thermal switch $S_1$ have very short duty cycles and exhibit relatively synchronous operation to one another. The pulse width and the timing of the closing and opening cycles are likely to differ depending on the transient characteristics of Peltier device 21 and the integrity of the thermal conduction from Peltier device 21 to hot sink 26 and cold sink 25.

Figure 4:
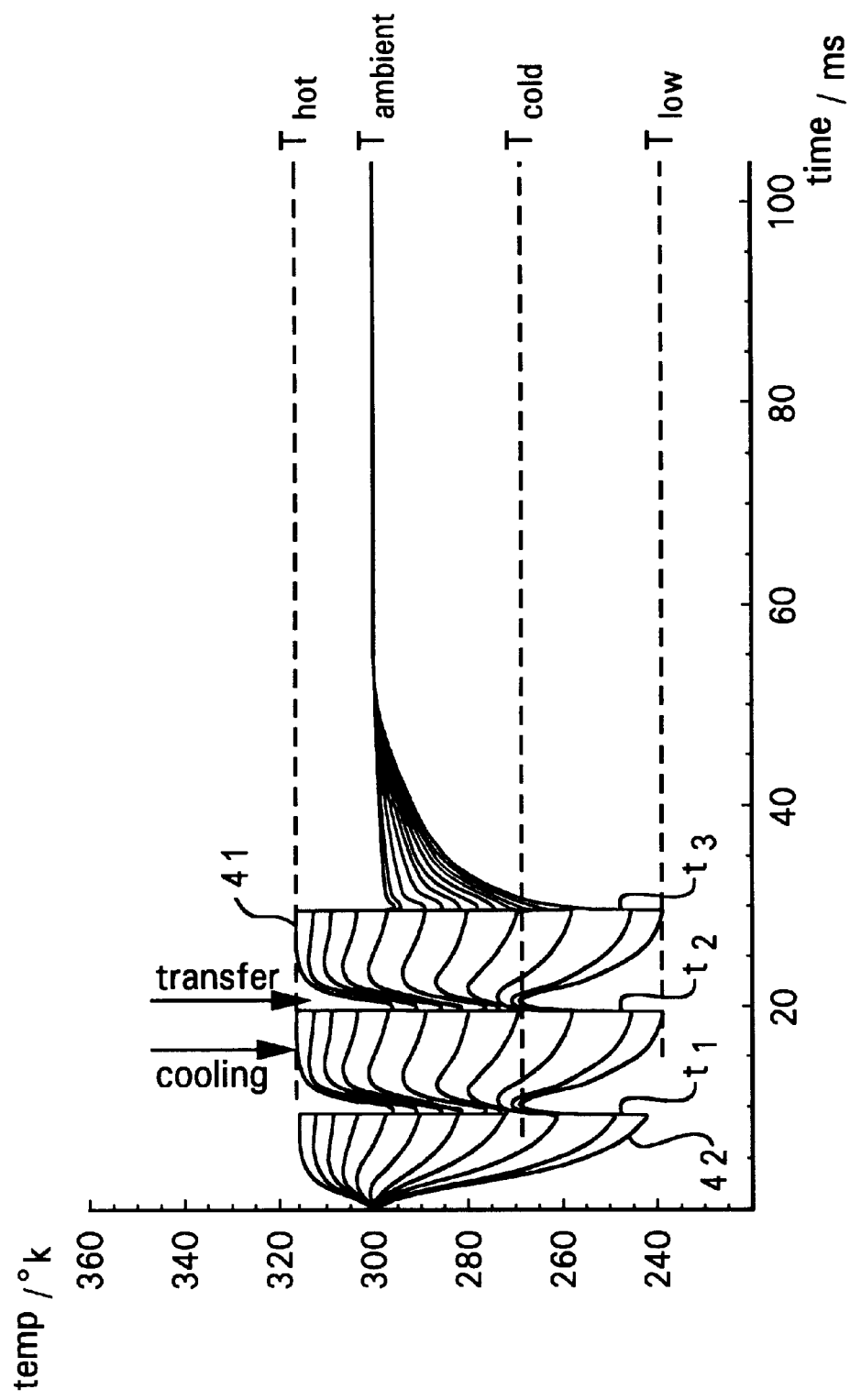
FIG. 4 is a graphical illustration of a temperature profile of the Peltier device within the thermoelectric cooling system from FIG. 2, in accordance with a preferred embodiment of the present invention.

With reference now to FIG. 4, there is depicted a graphical illustration of a temperature profile of Peltier device 21, in accordance with a preferred embodiment of the present invention. Hot end profile 41 is where Peltier device 21 interfaces with hot sink 26, and cold end profile 42 is where Peltier device 21 interfaces with cold sink 25. The lines between hot end 41 and cold end 42 depicts the temperature gradients at various points physically located within Peltier device 21 between the two interfaces. Time $t_1$ and time $t_2$ are the points at which switch $S_2$ closes such that heat transfer occurs between cold sink 25 and mass 24. After time $t_3$, all power from variable current supply 27 is shut off, and thus all regions of Peltier device 21 exponentially converges towards the ambient temperature $T_{ambient}$.

As has been described, the present invention provides an improved thermoelectric cooling system for IC devices. The present invention quasi-statically charges a Peltier device to reduce both the negative joule heating component and the negative conductivity component of the net heat energy transported by the Peltier device. As a result, irreversible losses are reduced by the present invention.

Although a preferred embodiment of the present invention indicates current pulses are supplied based upon the temperature differential across the Peltier device, the present invention can be altered to sense only the temperature of the cold sink. Furthermore, as yet another alternative embodiment of the present invention, the current pulses supplied to the Peltier device can be controlled as a function of the rate of change of temperature in time.

While the invention has been particularly shown and described with reference to a preferred embodiment, it will be understood by those skilled in the art that various changes in form and detail may be made therein without departing from the spirit and scope of the invention.

What is claimed is:

1. A thermoelectric cooling system, comprising:
   a first thermal sink having a temperature higher than an ambient temperature;
   a second thermal sink having a temperature lower than said ambient temperature;
   a thermoelectric element continuously coupled to said first thermal sink and selectively coupled to said second thermal sink via a mass; and
   a variable current source for providing a controlled current pulse to said thermoelectric element such that heat transfer is achieved between said thermoelectric element and said thermal sinks.

2. The thermoelectric cooling system according to claim 1, wherein said thermoelectric element includes a p-type thermoelectric element and an n-type thermoelectric element.

3. The thermoelectric cooling system according to claim 1, wherein a rise time of said controlled current pulse is directly proportional to a temperature differential across said thermoelectric element.

4. The thermoelectric cooling system according to claim 1, wherein a rise time of said controlled current pulse is directly proportional a rate of the temperature change of said second thermal sink.

5. The thermoelectric cooling system according to claim 1, wherein said variable current source further includes a voltage supplied to said thermoelectric element.

6. A method for providing thermoelectric cooling system, said method comprising the steps of:

provideing a first thermal sink having a temperature higher than an ambient temperature;

providing a second thermal sink having a temperature lower than said ambient temperature;

continuously coupling a thermoelectric element to said first thermal sink and selectively coupling said thermoelectric element to said second thermal sink via a mass; and providing a controlled current pulse to said thermoelectric element such that heat transfer is achieved between said thermoelectric element and said thermal sinks.

7. The method according to claim 6, wherein said thermoelectric element includes a p-type thermoelectric element and an n-type thermoelectric element.

8. The method according to claim 6, wherein a rise time of said controlled current pulse is directly proportional to a temperature differential across said thermoelectric element.

9. The method according to claim 6, wherein a rise time of said controlled current pulse is directly proportional a rate of the temperature change of said second thermal sink.

10. The method according to claim 6, wherein said controlled current pulse further includes a voltage supplied to said thermoelectric element.

* * * * *